United States Patent [19]

Davis

[11] Patent Number: 4,591,807

[45] Date of Patent: May 27, 1986

[54] LOW POWER, LOW VOLTAGE OSCILLATOR

[75] Inventor: Walter L. Davis, Coral Springs, Fla.

[73] Assignee: Motorola, Inc., Schaumburg, Ill.

[21] Appl. No.: 677,276

[22] Filed: Dec. 3, 1984

[51] Int. Cl.[4] .......................... H03B 5/36; H03F 3/04
[52] U.S. Cl. ............................ 331/116 R; 331/108 D; 331/158; 330/288
[58] Field of Search ........ 331/108 D, 116 R, 116 FE, 331/117 R, 158, 159; 330/89, 257, 288, 331; 323/315, 316

[56] References Cited

U.S. PATENT DOCUMENTS

| | | | |
|---|---|---|---|
| 3,684,981 | 8/1972 | Kreitz | 331/116 R |
| 3,886,485 | 5/1975 | Takahashi | 331/111 |
| 3,989,997 | 11/1976 | Ahmed | 331/20 |
| 4,336,507 | 6/1982 | Bynum et al. | 331/108 D |
| 4,350,961 | 9/1982 | Toyokuni | 331/158 |
| 4,371,792 | 2/1983 | Dobkin | 307/255 |
| 4,389,638 | 6/1983 | Gontowski, Jr. | 340/384 E |
| 4,418,323 | 11/1983 | Tokumo et al. | 331/111 |
| 4,467,289 | 8/1984 | Okada | 330/288 |

Primary Examiner—Eugene R. LaRoche
Assistant Examiner—Robert J. Pascal
Attorney, Agent, or Firm—Martin J. McKinley; Joseph T. Downey; Edward M. Roney

[57] ABSTRACT

A low power, fast start up time crystal oscillator circuit has an amplifier portion powered from a one cell battery. The input stage of the amplifier portion is a common emitter amplifier circuit. A second stage includes a dual collector current mirror circuit having a current established at 3 times the input stage current. The output stage includes a current mirror circuit having a current established at 4 times the second stage current. A negative D.C. feedback circuit biases the amplifier portion. A single transistor interface circuit boosts and limits the output of the amplifier portion and permits the oscillator to drive other circuits that operate at higher voltages than the amplifier battery voltage.

14 Claims, 3 Drawing Figures

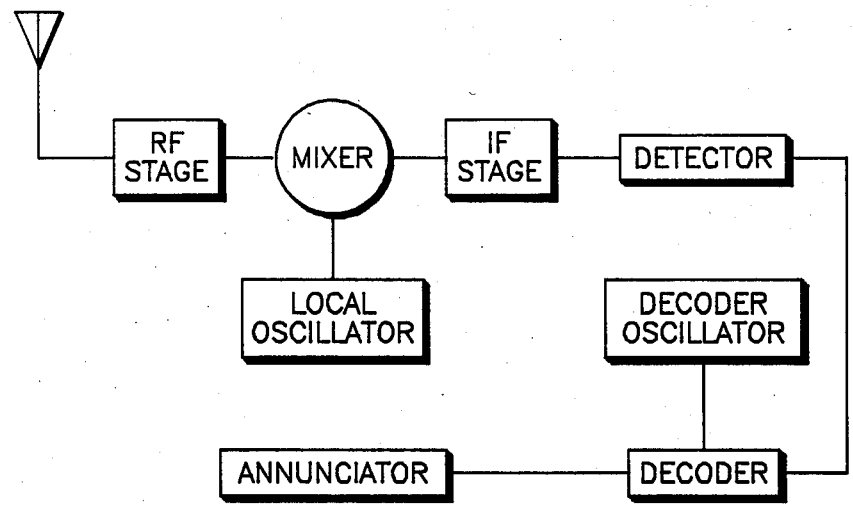
FIG. 1A
FIG. 1B
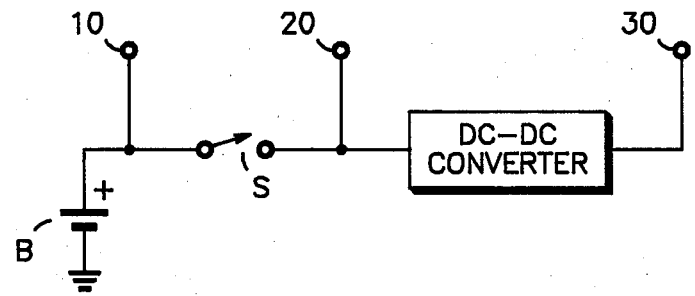

LOW POWER, LOW VOLTAGE OSCILLATOR

BACKGROUND OF THE INVENTION

This invention relates to the field of electronic oscillator circuits and more particularly to low power, low voltage crystal oscillator circuits that find application in battery operated personal paging receivers.

In the design of selective call or paging receivers it is desirable to prolong the operating time between battery charges or replacement. As the physical size of paging receivers has been reduced over the years, the size and electrical capacity of their batteries have also been reduced, potentially causing a corresponding reduction in the paging receiver's operating time. To compensate for the reduced battery capacity, development work has been directed towards reducing the power drain of all circuits in the paging receiver. This work has lead to the development of both low power circuit designs and to the development of sophisticated switching methods, or "battery saver techniques", whereby portions of the paging receiver are switched ON only for brief intervals and only when they are required to be on, as determined by the selective call coding protocal.

A paging receiver is usually powered from a one cell battery having a voltage in the range of 1.1 to 1.5 volts. Ideally, the paging receiver circuits are powered directly from the battery, however, some circuits will not operate at these low voltages and it becomes necessary to add a DC-DC converter to step-up the voltage. Because DC-DC converters are less than 100% efficient and they require larger and more expensive components as their load increases, it is desirable to operate as few circuits as possible from the DC-DC converter.

Paging receivers typically contain a selective signalling decoder to decode the information transmitted to the paging receiver. The decoder uses a crystal oscillator to provide accurate time base signals for its operation. CMOS microcomputers, which require the stepped-up voltage, are commonly used as decoders.

It is desirable that the paging receiver immediately generate a "turn on alert signal" upon the activation of the ON switch to inform the user that the battery is sufficiently charged and that the paging receiver is operating properly. The generation of this alert signal requires that the decoder oscillator start up as quickly as possible, for even a delay of one second between the activation of the ON switch and the generation of the alert signal has been demonstrated to be unacceptable to the users of paging receivers.

It is well understood in the art that the start up time of a crystal oscillator circuit is inversely proportional to both the bandwidth of the crystal and the gain of the oscillator circuit at the crystal frequency. The high Q or quality factor associated with quartz crystals results in very narrow crystal bandwidth and, therefore, potentially long start up times. Therefore, it is necessary to provide high circuit gain to achieve reasonable start up times. However, unless the circuit gain is reasonably predictable and stable, too high a circuit gain may cause the circuit to oscillate in an uncontrolled mode, or to oscillate at a spurious frequency associated with an undesired crystal response.

Presently, low power, low voltage oscillator circuits have been fabricated using CMOS integrated circuit technology, but these circuits have suffered from a number of deficiencies including highly variable power drain characteristics, low and inconsistent amplifier gains that cause unpredictable oscillator start up times, and the inability to resume oscillation under all supply voltage conditions when the power source is interrupted. These operational deficiencies are caused by the normal variations in the characteristics of transistors fabricated with conventional CMOS integrated circuit technology. In particular, the gain of CMOS amplifiers is inherently low when they are operated at low power supply voltages. This gain reduction is especially drastic when the power supply voltage is reduced to the lower end of the normal voltage range of a one cell battery, typically 1.1 volts.

To overcome these problems, many CMOS oscillators are intentionally left ON at all times, even when the paging receiver is turned OFF. This eliminates the variable start up time problem and only requires the oscillator to start when a new battery, with high terminal voltage, is placed in the paging receiver.

SUMMARY OF THE INVENTION

Accordingly, it is an object of this invention to provide a low power crystal oscillator circuit that can be reliably operated over both a wide supply voltage range (down to 1.0 volt or less) and over a wide temperature range. Another object of the invention is to provide a crystal oscillator circuit that rapidly and predictably achieves a steady state condition after power is applied to the oscillator (within 200 milli-seconds or less). Still another object of the invention is to provide a crystal oscillator circuit having an oscillator output interface circuit capable of driving another circuit operated at a higher supply voltage, and whereby the interface circuitry draws zero power when the higher supply voltage is disabled. Yet another object of the invention is to provide a crystal oscillator circuit that can be implemented in the form of a monolithic integrated circuit whereby the performance of the oscillator is essentially unaffected by variations in the processing parameters associated with the integrated circuit fabrication process.

The above and other objects and advantages of the present invention are provided in the preferred embodiment by an amplifier circuit having a plurality of current mirror amplifying stages. The amplifier stages are biased in their respective operating regions by a feedback resistor, coupled between the output and input of the amplifier circuit. A tuned circuit, a quartz crystal and three capacitors in the preferred embodiment, determines the frequency of oscillation and is also connected between the output and input of the amplifier circuit. Connected to the output of the amplifier circuit is an interface circuit whereby the low amplitude output signal of the amplifier is boosted so that the oscillator may be used to drive another circuit that operates at a voltage higher than the power supply voltage of the oscillator.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 1 is a block diagram of a basic paging receiver containing a decoder and decoder oscillator.

DESCRIPTION OF THE PREFERRED EMBODIMENT

Figure 2:
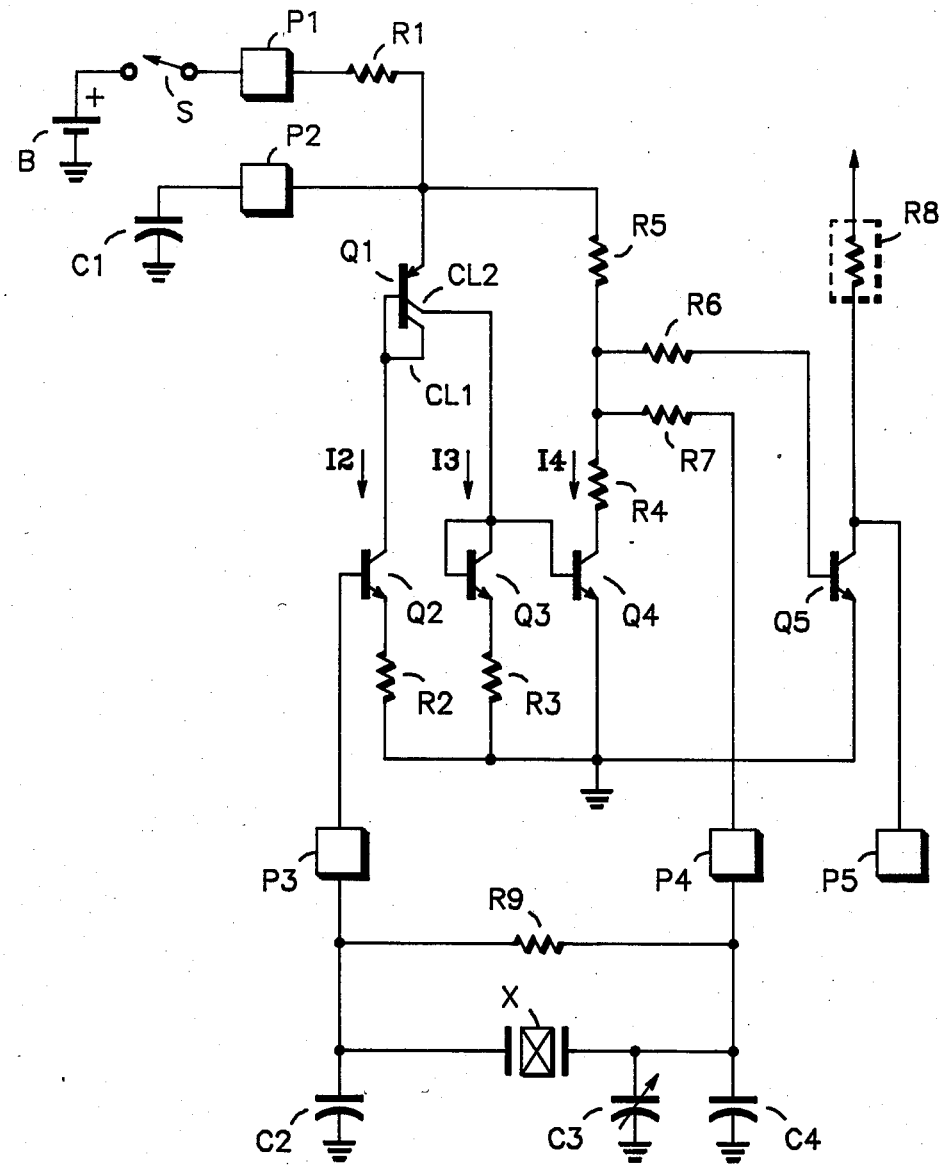
FIG. 2 is a schematic diagram of the present invention.

Referring now to FIG. 1 wherein a block diagram of a basic paging receiver is illustrated. Depicted in FIG. 1A are the R.F. stage, mixer, local oscillator, I.F. stage, and detector that comprise the "front end" of a basic radio receiver, and are well known in the art. Connected to the detector output is a decoder, which may comprise a microcomputer with associated interface hardware. Connected to the decoder is a decoder oscillator, which supplies an accurate time base signal to the decoder. A decoder oscillator is the preferred application for the present invention, although the invention is well suited for any other application that requires a low power or low voltage oscillator. Connected to the output of the decoder is an annunciator, which can be an audio or visual transducer, an information display, or any other means of communication between the paging receiver and the user.

Depicted in FIG. 1B is a power supply portion comprised of battery B, ON/OFF switch S, and a DC-DC converter. This portion supplies power to each of the circuits in the paging receiver through one of three interconnect terminals 10, 20, or 30. Terminal 10 supplies continuous battery voltage and may be used to supply power to any circuit with a start up time problem, such as a decoder oscillator that uses the prior art CMOS technology previously mentioned. Terminal 20 supplies battery voltage only when switch S is in the ON position. Unless a particular circuit cannot be powered from terminal 20, all circuits are preferably powered from this terminal, including the preferred embodiment of the low power, low voltage oscillator illustrated in FIG. 2. Terminal 30 supplies power to all circuits that require a voltage higher than the voltage of the one cell battery. When CMOS microcomputers are used as decoders, they are typically powered from terminal 30. The interface circuit portion of the low power, low voltage oscillator of FIG. 2 is also powered from the output of the DC-DC converter; the B++ terminal of FIG. 2 being connected to terminal 30 of FIG. 1B.

Referring now to FIG. 2 wherein a schematic diagram of the present invention is illustrated. This embodiment of the invention is intended for use in a personal paging radio receiver wherein the output of the oscillator is connected to a CMOS microprocessor for the purpose of providing the timing signal necessary for the proper decoding of the information transmitted to the paging receiver. It should be realized, however, that the oscillator may be used to drive circuits other than CMOS microprocessors and its utility is not limited to paging receivers.

It will be understood that in the preferred embodiment portions of the oscillator are implemented in integrated circuit form, while other portions of the circuit are implemented as discrete components. Wire bonding pads P1–P5 are provided for interconnecting the discrete components to the integrated circuit.

The integrated circuit includes a transistor Q2 the base of which is connected to wire bonding pad P3. The emitter of transistor Q2 is connected to ground through resistor R2. The collector of transistor Q2 is connected to the base and collector CL1 of transistor Q1. The emitter of transistor Q1 is connected to the junction of resistors R1 and R5 and bonding pad P2. The other end of resistor R1 is connected to bonding pad P1. Collector CL2 of transistor Q1 is connected to the anode of diode Q3 and to the base of transistor Q4. (It should be noted that "transistor" Q3 is interconnected as a diode, the collector and base forming the anode and the emitter forming the cathode.) The cathode of diode Q3 is connected to ground through resistor R3. The emitter of transistor Q4 is connected to ground while the collector of transistor Q4 is connected to one end of resistor R4. The other end of resistor R4 is connected to the junction of resistors R5, R6 and R7. The other end of resistor R6 is connected to the base of transistor Q5, while the other end of resistor R7 is connected to bonding pad P4. The emitter of transistor Q5 is connected to ground and the collector of transistor Q5 is connected to one end of resistor R8 and to bonding pad P5. The other end of resistor R8 is connected to the B++ power supply, which is the voltage source for the CMOS microcomputer in the preferred embodiment.

The remaining components are external to the integrated circuit. Crystal X, resistor R9, and capacitors C3 and C4 are connected to bonding pad P4. The other end of resistor R9 and the other end of crystal X are connected to bonding pad P3 as well as capacitor C2. The other ends of capacitors C2, C3, and C4 are connected to ground. The positive terminal of battery B is connected to bonding pad P1 through ON/OFF switch S, and the negative terminal of battery B is connected to ground. Capacitor C1 is connected to bonding pad P2 while the other end of C1 is connected to ground.

The oscillator amplifier consists of three direct coupled gain stages comprised of transistors Q1, Q2, and Q4, diode Q3, and resistors R2 through R5. In the preferred embodiment, the A.C. voltage gain of the oscillator amplifier is substantially 31, but the gain can be set anywhere within a wide range of values. The feedback portion of the oscillator circuit consists of resistors R7 and R9, crystal X, and capacitors C2, C3 and C4. Resistor R6, transistor Q5, and resistor R8 comprise the interface circuit portion of the oscillator circuit. Resistor R1 and capacitor C1 are interconnected as a lowpass filter, isolating the amplifier circuit from the power input bonding pad P1. In the preferred embodiment, power is supplied to the amplifier circuit from a one cell battery B through an ON/OFF switch S.

In the preferred embodiment, resistor R1 has a value of 2 kilo-ohms, resistor R2 is 39 kilo-ohms, resistor R3 is 38 kilo-ohms, resistor R4 is 47 kilo-ohms, resistor R5 is 150 kilo-ohms, resistor R6 is 300 kilo-ohms, resistor R7 and R8 are 150 kilo-ohms, and resistor R9 has a value of 10 mega-ohms. Also, capacitor C1 has a value of 1 microfarad, capacitor C2 is 24 picofarads, capacitor C3 is a trimmer capacitor with a value of 2 to 10 picofarads, and capacitor C4 is 15 picofarads. Transistors Q1, Q2, Q4, and Q5 all have a beta in excess of 100. Finally, crystal X is a 32,768 Hz crystal of the type commonly used in wristwatches and other timepiece applications.

Resistor R9 provides a unity gain negative D.C. feedback path between the oscillator output at bonding pad P4 and the oscillator input at bonding pad P3. The D.C. output voltage at bonding pad P4 is the same as the input voltage at bonding pad P3, plus any voltage drop across resistor R9. The voltage drop across resistor R9, however, is inconsequential, because the D.C. current through resistor R9 is on the order of 0.003 micro-amps (for a battery B voltage of 1.4 volts). The D.C. voltage necessary to bias the base of transistor Q2 (which is connected to bonding pad P3) in the conduction region is approximately 0.6 volts. Thus, the D.C. output voltage at bonding pad P4 and the D.C. input voltage at bonding pad P3 are both biased at approximately 0.6 volts.

With the D.C. output voltage at bonding pad P4 being substantially fixed at 0.6 volts, the collector current I4 of transistor Q4 is determined by the value of resistor R5 and the voltage of battery B. For a battery voltage of 1.4 volts and resistor R5 having a resistance of 150 kilo-ohms, the collector current I4 of transistor Q4 is approximately 5.33 micro-amps.

Diode Q3, resistor R3, and transistor Q4 are interconnected to form a current mirror whereby the ratio of collector current I4 of transistor Q4 to the anode current I3 of diode Q3 is determined by the value of resistor R3. Resistor R3 has a resistance of 38 kilo-ohms in the preferred embodiment which results in a ratio of I4 to I3 substantially equal to 4.

Transistor Q1 is a dual collector transistor whereby the area of collector CL2 is three times the area of collector CL1, thereby setting the ratio of the anode current I3 of diode Q3 to the collector current I2 of transistor Q2 substantially equal to 3. Thus, transistor Q1 forms a bipolar transistor current mirror circuit wherein the base and collector CL1 form the input of the current mirror circuit and collector CL2 forms the output.

Using these previously defined current ratios and the value of collector current I4 equal to 5.33 micro-amps, the values of anode current I3 and collector current I2 are 1.33 micro-amps and 0.444 micro-amps respectively. Thus, the total average current consumed by the amplifier circuit is approximately 7.1 micro-amps.

The A.C. feedback path is provided by crystal X, fixed capacitors C2 and C4, and trimmer capacitor C3, which are external to the integrated circuit. These components are interconnected in a Colpitts oscillator configuration. Minor adjustments may be made to trimmer capacitor C3 to precisely set the oscillation frequency.

Returning to the integrated circuit, resistors R6 and R8, and transistor Q5 form an interface circuit between the amplifier circuit and the load connected to bonding pad P5. This interface circuit is directly coupled to an output of the amplifier circuit (at the junction of resistors R5 and R6) and is biased at its switching threshold level by the 0.6 volt D.C. output of the amplifier. (Because the voltage drop across resistor R7 is insignificant, the voltage appearing at the junction of resistors R5 and R6 is substantially the same as the amplifier output voltage at bonding pad P5). A positive A.C. voltage swing at the output of the amplifier causes current to flow through resistor R6 and the base of transistor Q5, causing transistor Q5 to switch ON, whereby the output of the interface circuit at bonding pad P5 is pulled substantially to ground. Conversely, a negative A.C. voltage swing at the output of the amplifier circuit causes the voltage at the base of transistor Q5 to drop below the level necessary to turn transistor Q5 ON, thereby causing the output of the interface circuit at bonding pad P5 to be pulled up to B++ through resistor R8. Because of the high gain of the interface circuit, its output is substantially binary, switching between ground and B++. Furthermore, the interface circuit draws essentially zero power from the battery whenever the B++ output of the DC-DC converter is disabled.

Obviously, numerous modifications and variations of the present invention are possible in light of the above teachings, including, but not limited to, the insertion of additional stages between the amplifier input and output. It is therefore to be understood that within the scope of the appended claims, the invention may be practiced otherwise as specifically described herein.

What is claimed as new and desired to be secured by Letters Patent is:

1. A low power, low voltage oscillator circuit, comprising in combination:

an amplifier having an input and an output, said amplifier having at least a first, second and third stage, each stage having an input, an output, and an associated output current, wherein said first stage input is connected to said amplifier input, and said third stage output is connected to said amplifier output, said stages being interconnected in a cascade fashion, whereby the output of a preceding stage is connected to the input of the following stage;

said second stage including a current mirror circuit wherein said second stage output current is substantially a first fixed multiple of the preceding stage output current;

said third stage including a current mirror circuit wherein said third stage output current is substantially a second fixed multiple of the preceding stage output current;

a feedback biasing means, connected between said amplifier output and said amplifier input, for biasing said ampifier stages in their respective operating regions; and a tuned circuit means, connected between said amplifier output and said amplifier input, for selecting the frequency of oscillation.

2. A low power, low voltage oscillator circuit, according to claim 1, wherein said first stage comprises a common emitter transistor amplifier, the base of said transistor amplifier being connected to said first stage input and the collector of said transistor amplifier being connected to said first stage output.

3. A low power, low voltage oscillator circuit, according to claim 2, wherein said common emitter transistor amplifier comprises a first NPN transistor, the emitter of said first NPN transistor being connected to ground through a first resistor.

4. The low power, low voltage oscillator of claim 3 wherein:

said second stage comprises a PNP transistor having a first and second collector, said first collector being connected to the base of said PNP transistor and to the input of said second stage, said second collector being connected to the output of said second stage, the emitter of said PNP transistor being connected to a source of positive voltage; and said third stage comprises a diode and a second NPN transistor, the anode of said diode being connected to the base of said second NPN transistor and to the input of said third stage, the cathode of said diode being connected to ground through a second resistor, the emitter of said second NPN transistor being connected to ground, and the collector of said second NPN transistor being connected to said source of positive voltage through a pair of series connected resistors, the junction of said pair of resistors being connected to said third stage output.

5. The low power, low voltage oscillator of claim 4, wherein said tuned circuit means comprises:
 a quartz crystal, connected between said amplifier output and input;
 a first capacitor connector between said amplifier output and ground; and
 a second capacitor connected between said amplifier input and ground.

6. The low power, low voltage oscillator circuit of claim 4, further comprising:
 an interface circuit, connected to the output of said third stage, said interface circuit having a third NPN transistor connected to said output of said third stage through a third resistor, the emitter of said third NPN transistor being connected to ground, and the collector of said third NPN transistor being connected to a second source of positive voltage through a fourth resistor, the collector of said third NPN transistor being connected to the output of said interface circuit.

7. A low power, low voltage oscillator, according to claim 1, wherein said second stage current mirror circuit comprises a dual collector transistor having a first and a second collector, said first collector being connected to the base of said dual collector transistor and to the input of said second stage, said second collector being connected to the output of said second stage.

8. A low power, low voltage oscillator circuit, according to claim 1, wherein said third stage current mirror circuit comprises a diode and a transistor, said diode being connected to the base of said transistor and to the input of said third stage, and the collector of said transistor being connected to a pair of series connected resistors, the junction of said pair of resistors being connected to said third stage output.

9. The low power, low voltage oscillator circuit, according to claim 8, wherein said tuned circuit means comprises:
 a quartz crystal connected between said amplifier output and input;
 a first capacitor connected to said amplifier output; and
 a second capacitor connected to said amplifier input.

10. A low power, low voltage oscillator circuit, comprising in combination:
 an amplifier having a plurality of interconnected current mirror amplifying stages, said amplifier having an input and an output;
 a feedback biasing means, connected between said amplifier output and said amplifier input, for biasing said amplifier stages in their respective operating regions;
 a tuned circuit means, connected between said amplifier output and said amplifier input, for selecting the frequency of oscillation; and
 an interface circuit means, connected to said output of said amplifier, for increasing the amplitude of an amplifier output signal at said output of said amplifier, whereby the output signal of the interface circuit may be used to drive other circuits that operate at voltages higher than the output voltage of the oscillator.

11. The low power, low voltage oscillator circuit of claim 10, wherein said interface circuit means comprises a transistor, the base of said transistor being connected to said output of said amplifier through a first resistor, and the collector of said transistor being connected to a second resistor and to the output of said interface circuit means.

12. In a paging receiver including a decoder circuit for decoding information transmitted to the paging receiver, a low power, low voltage oscillator circuit connected to said decoder circuit, said oscillator circuit comprising in combination:
 an amplifier having an input and an output, said amplifier having a first, second and third stage, each stage having an input, an output, and an associated output current, wherein said first stage input is connected to said amplifier input, and said third stage output is connected to said amplifier output, said stages being interconnected in a cascade fashion, whereby the output of a preceding stage is connected to the input of the following stage;
 a feedback biasing means connected between said amplifier output and said amplifier input, for biasing said amplifier stages in their respective operating regions; and
 a tuned circuit means including a quartz crystal connected between said amplifier output and input, a first capacitor connected between said amplifier output and ground, and a second capacitor connected between said amplifier input and ground, for selecting the frequency of oscillation;
 whereby said oscillator exhibits a fast start up time when power is applied.

13. The oscillator circuit of claim 12, wherein:
 said first stage comprises a first NPN transistor, the base of said first NPN transistor being connected to said first stage input, the collector of said first NPN transistor being connected to said first stage output, the emitter of said first NPN transistor being connected to ground through a first resistor;
 said second stage comprises a PNP transist or having a first and second collector, said first collector being connected to the base of said PNP transistor, said second collector being connected to the output of said second stage, the emitter of said PNP transistor being connected to a source of positive voltage; and
 said third stage comprises a diode and a second NPN transistor, the anode of said diode being connected to the base of said second NPN transistor and to the input of said third stage, the cathode of said diode being connected to ground through a second resistor, the emitter of said second NPN transistor being connected to ground, and the collector of said second NPN transistor being connected to said source of positive voltage through a pair of series connected resistors, the junction of said pair of resistors being connected to said third stage output.

14. The oscillator circuit of claim 13, further comprising:
 an interface circuit, connected to the output of said third stage, said interface circuit having a third NPN transistor connected to said output of said third stage through a third resistor, the emitter of said third NPN transistor being connected to ground, and the collector of said third NPN transistor being connected to a second source of positive voltage through a fourth resistor, the collector of said third NPN transistor connected to the output of said interface circuit.

* * * * *